(12) United States Patent
Sartori et al.

(10) Patent No.: US 7,793,031 B2
(45) Date of Patent: Sep. 7, 2010

(54) MEMORY ARCHITECTURE WITH SERIAL PERIPHERAL INTERFACE

(76) Inventors: Laura Sartori, Via Piave, 2, I-45030 Occhiobello (RO) (IT); Adamo Corsi, Via Boccaccio, 451, I-20099 Sesto San Giovanni (MI) (IT); Marco Roveda, Via Ticino, 33/22, I-20086 Motta Visconti (PC) (IT); Giuseppe Maurizio Lorusso, Via T. Tasso, 2, I-70026 Modugno (BA) (IT); Daniela Ruggeri, Via Conca d'Oro Il Caminetto A, I-98168 Messina (IT); Demetrio Pellicone, Via Modigliani, 1, I-20052 Monza (MI) (IT)

( * ) Notice: Subject to any disclaimer, the term of this patent is extended or adjusted under 35 U.S.C. 154(b) by 221 days.

(21) Appl. No.: 11/530,199

(22) Filed: Sep. 8, 2006

(65) Prior Publication Data

US 2007/0115743 A1    May 24, 2007

(30) Foreign Application Priority Data

Sep. 9, 2005    (EP)    ................................. 05425634

(51) Int. Cl.
G06F 13/20    (2006.01)
G06F 13/38    (2006.01)
G06F 13/00    (2006.01)
(52) U.S. Cl. ..................... 710/313; 710/65; 710/103
(58) Field of Classification Search ................. 710/313, 710/65; 711/103
See application file for complete search history.

(56) References Cited

U.S. PATENT DOCUMENTS 4,796,235 A * 1/1989 Sparks et al. .......... 365/189.07

| 6,208,548 | B1 * | 3/2001 | Kawagoe | ..................... 365/63 |
| 6,266,271 | B1 * | 7/2001 | Kawamura | ............ 365/185.04 |
| 6,359,822 | B1 | 3/2002 | Zink et al. | ................... 365/221 |
| 6,510,487 | B1 * | 1/2003 | Raza et al. | .................. 711/100 |
| 7,078,929 | B1 * | 7/2006 | Draper et al. | ................. 326/16 |
| 7,228,372 | B2 * | 6/2007 | Yoshimura et al. | .......... 710/110 |
| 7,350,717 | B2 * | 4/2008 | Conner et al. | ............... 235/492 |

(Continued)

OTHER PUBLICATIONS

Cihan Tuzcu, Digital Design of Serial Flash Memory Controller with SPI Interface For Embedded Systems, May 2004, Sabanci University.*

(Continued)

*Primary Examiner*—Mark Rinehart
*Assistant Examiner*—Christopher A Daley
(74) *Attorney, Agent, or Firm*—Trop, Pruner & Hu, P.C.

(57) ABSTRACT

A memory architecture includes a memory including a Command Set, and a serial peripheral interface (SPI) for connecting the memory to a generic host device. The SPI includes a data in line for supplying output data from the host device to inputs of the memory; a data out line for supplying output data from the memory to input of the host device; a clock line driven by the host device; and an enable line that allows the memory to be turned on and off by the host device. The memory is a NAND Flash Memory. The SPI includes an I/O registers block, including an SPI label register and a data register for driving separately data, commands and addresses directed to the memory from the corresponding SPI label registers.

15 Claims, 5 Drawing Sheets

U.S. PATENT DOCUMENTS

| | | |
|---|---|---|
| 7,411,859 B2 * | 8/2008 | Sohn et al. ............. 365/230.05 |
| 7,567,461 B2 * | 7/2009 | Roohparvar ........... 365/185.19 |
| 2001/0038547 A1 | 11/2001 | Jigour et al. ................. 365/43 |
| 2003/0135690 A1 | 7/2003 | Lee et al. .................... 711/103 |
| 2006/0067123 A1 * | 3/2006 | Jigour et al. ........... 365/185.05 |
| 2006/0184717 A1 * | 8/2006 | Rothman et al. ............ 711/103 |
| 2006/0218323 A1 * | 9/2006 | Chen et al. ................... 710/65 |
| 2006/0236166 A1 * | 10/2006 | Zimmer et al. .............. 714/723 |
| 2006/0248267 A1 * | 11/2006 | Xie ............................ 711/103 |

OTHER PUBLICATIONS

Altium, SPI-W Seriasl Peripheral Interface Controller, May 27, 2005.*

Samsung Electronics, S3F49DAX MultiMediaCard Controllers Datasheet Revision 1.0, Aug. 17, 2004, Internet Article, www.samsung.com.

Memory Products Databook, $2^{nd}$ Edition, Aug. 1992, SGS Thomson Microelectronics, IT, Serial Access CMOS 4k Bit EEPROM Datasheet.

Voilmer, Neuigkeiten Bei Nichfluechtigen Speichern Developments in Flash, Fcram and Sram Computer Memories, Elektronik Industrie, vol. 32, No. 10, Oct. 2001, pp. 43-47.

Texas Instruments, TMS320x281x, 280x DSP Serial Peripheral Interface (SPI) Reference Guide, Nov. 2004, Internet Article, http://focus.ti.com.lit/ug/spru059b/spru059b.pdf.

Kalinsky et al., Introduction to Serial Peripheral Interface, Embedded Systems Programming, vol. 15, No. 2, Feb. 1, 2002, www.ebmedded.com.showarticle.

* cited by examiner

| SPI INSTRUCTION | SPI CODE | Information type | Information Size (Byte) |
|---|---|---|---|
| Memory Command | 01h | Nand Command Code | 1 |
| Memory Address | 02h | Memory Address | 1 |
| Memory Data In | 04h | Memory Data In | - |
| Memory Data Out | 08h | Memory Data Output Request | - |
| StatusReg Output | 10h | Status Register Output Request | 1 |
| SetMSB | 81h-42h | Command | X |
| SetLSB | 81h-24h | Command | X |

FIG. 3

MEMORY ARCHITECTURE WITH SERIAL PERIPHERAL INTERFACE

FIELD OF THE INVENTION

The present invention relates to a memory architecture. More specifically, the invention relates to a memory architecture comprising a memory device, including a Command Set and a serial peripheral interface (SPI) for connecting the memory device to a generic host device.

The invention also relates to a communication protocol for implementing the communication between a memory device connected to a host device through a serial peripheral interface (SPI). The invention particularly, but not exclusively, relates to a memory architecture of the Flash type and the following description is made with reference to this field of application for convenience of explanation only.

BACKGROUND OF THE INVENTION

A serial peripheral interface (SPI) is an interface that enables the serial (one bit at a time) exchange of data between two devices, one called a master and the other called a slave. An SPI operates in full duplex mode. This means that data can be transferred in both directions at the same time.

More particularly, an SPI is a full-duplex synchronous serial interface for connecting low/medium-bandwidth external devices using four wires. SPIs communicate using a master/slave relationship over two data lines and two control lines.

DataIn: a first communication line that supplies output data from a master device to inputs of slave devices.

DataOut: a second communication line that supplies output data from a slave device to an input of the master device. It is important to note that there can be no more than one slave device that is transmitting data during any particular transfer.

CLK or Serial Clock: a first control line driven by the master device, regulating the flow of data bits.

CE_N or Slave Select: a second control line that allows slave devices to be turned on and off by the master with a hardware control.

In particular, the CE_N line corresponds to the case where a slave or peripheral device is selected.

From a hardware point of view it is based on four pins, corresponding to the above four wires or lines. These pins are mostly active-low.

In particular, in an unselected state, the DataOut lines are in a high-impedance (hi-Z) condition, and are therefore inactive. The master device decides with which slave or peripheral device it wants to communicate.

The clock line CLK is brought to the slave device whether it is selected or not. The clock line serves as a synchronization of the data communication.

A dedicated communication protocol is designed to communicate with an SPI. The SPI is most often employed in systems for communication between the central processing unit (CPU) and peripheral devices. It is also possible to connect two microprocessors by an SPI.

Many types of devices can be controlled by an SPI, including shift registers, memory chips, port expanders, display drivers, data converters, printers, data storage devices, sensors and microprocessors. Data is transferred serially over a cable, input to a shift register, and transferred within each subsystem by parallel processing.

The main characteristics of the applications of SPIs are as follows: high speed, high board density and low cost. So, the SPI is advantageously used in the fields related to computers, consumer applications and automotive among many industrial applications.

It also known that serial interfaces have certain advantages over parallel interfaces. The most significant advantage is simpler wiring. In addition, serial interface cables can be longer than parallel interface cables because there is much less interaction (crosstalk) among the conductors in the cable.

Moreover, the high-speed serial SPI is preferred over parallel interfaces in applications where speed, board density and low costs are crucial. So, SPIs are widely used in computer applications including printers, hard disks, and motherboards; consumer applications including TVs, Set-Top Boxes, and DVDs; automotive applications including airbags, ABS, ESP, and car audio; and industrial applications including alarms, motor control, and instruments.

In general, peripheral devices using SPIs can be subdivided into the following categories: converters (ADC and DAC); memories (EEPROM and FLASH); real time clocks (RTC); sensors (temperature, pressure) and other (signal mixer, potentiometer, LCD controller, UART, CAN controller, USB controller, amplifier).

It should be noted that memory devices using SPIs are mostly EEPROM devices. The use of Flash memories is also possible.

The SPI is also simpler than a parallel interface, for example to connect a Flash memory to a microcontroller or an ASIC equipped with a serial bus. Serial buses are input/output interfaces supporting a mixed address/data protocol. The serial bus connectivity reduces the number of interface signals required.

In fact, the 4 signals required from SPI (data in, data out, clock and chip select) compared to 21 signals necessary to interface a 10-bit address parallel memory are advantageous because they are cheaper and less complex. As a result, the number of pins of the memory package (memory and bus master) is reduced.

Consequently, an SPI interface to memory can fit into a smaller and less expensive package. However, serial Flash memories are available in lower densities than Flash memories equipped with a parallel interface. The communication throughput between serial a Flash memory and a master processor is lower than Flash memories equipped with a parallel interface.

Consequently, the time to download code into the serial Flash memory and execute it is longer. As a result, serial Flash memories are usually used for small code storage associated with a cache RAM. The executable code is first programmed in the memory and write protected. After power-up, it is downloaded from memory to RAM from where it is executed by a master processor.

Also, even though Flash memories are far simpler than EEPROM memories from a structural point of view, with some advantages in terms of occupied silicon area and costs, in Flash memories it is quite expensive to program several memory words at a time in terms of dissipated power.

Such known memory devices have a capacity range from a few Kbits up to 64 MBit and clock frequencies up to 40 MHz. In such memories, page mode programming is generally performed by storing all words in the SRAM and by reading then the content thereof for each single word. If this content is different from FF (in a Flash memory bits with a logic value 1 indicate an erased cell), it will be stored in the corresponding word of the matrix sector page.

In particular, to perform a writing operation in a Flash memory, it is necessary to remove first the protection against writing of the matrix sector to be programmed, by addressing a convenient protection register. Afterwards, it is necessary to give a writing command, which will be decoded by a specific unit in charge thereof (usually indicate ad Command User Interface). This command serves to enable an internal programming algorithm and to pass then the matrix address and the datum or data to be programmed.

These three steps can be implemented according to the SPI protocol controlled by a state machine. Taking into account that a FLASH memory can program one byte at a time, to implement the page programming it is evidently necessary to store in a convenient structure the sequences of data to be programmed.

The simplest way for implementing the page programming is to use a buffer memory bank of the SRAM type (Static Random Access Memory). Obviously, such a memory bank is too complex for the task it has to perform. For example, it is not useful to have a random access to the memory, which involves the use of a row and column decoding circuitry, if in the end a following-address programming is performed on a FLASH memory.

In summary, the memory devices using SPIs which are known in the art have the following drawbacks: low density memory capacities, slow erase and slow page program.

SUMMARY OF THE INVENTION

An object of the present invention is to provide a memory device equipped with an SPI serial communication interface having structural and functional characteristics which overcome the limits which still affect the devices realized according to the prior art.

This and other objects, advantages and features in accordance with the present invention are provided by a memory architecture comprising a NAND Flash memory device, offering high density, fast erase and fast program, which is associated to an SPI having a communication protocol being completely independent from a command set of the NAND Flash memory.

The memory architecture comprises a NAND Flash memory including a Command Set, and a serial peripheral interface (SPI) for coupling the memory to a host device. The SPI may comprise a data in line for supplying output data from the host device to inputs of the memory, a data out line for supplying output data from the memory to an input of the host device, a clock line driven by the host device, and an enable line that allows the memory to be turned on and off by the host device.

Another aspect of the invention is directed to a communication protocol method for a serial peripheral interface (SPI) for coupling a memory to a host device. The memory is as defined above. The method comprises starting communication when a select signal on the enable line is switched from a turn-off to a turn-on level, synchronizing communication with a clock signal on the clock line, and starting at least one SPI instruction sequence with a one-byte instruction code.

BRIEF DESCRIPTION OF THE DRAWINGS

The characteristics and advantages of the memory architecture according to the invention will be apparent from the following description of embodiments thereof given by way of indicative and non-limiting example with reference to the annexed drawings. In such drawings:

FIG. 3 shows a table relating the internal instruction of the memory architecture of FIG. 1;

DETAILED DESCRIPTION OF THE PREFERRED EMBODIMENTS

Figure 1:
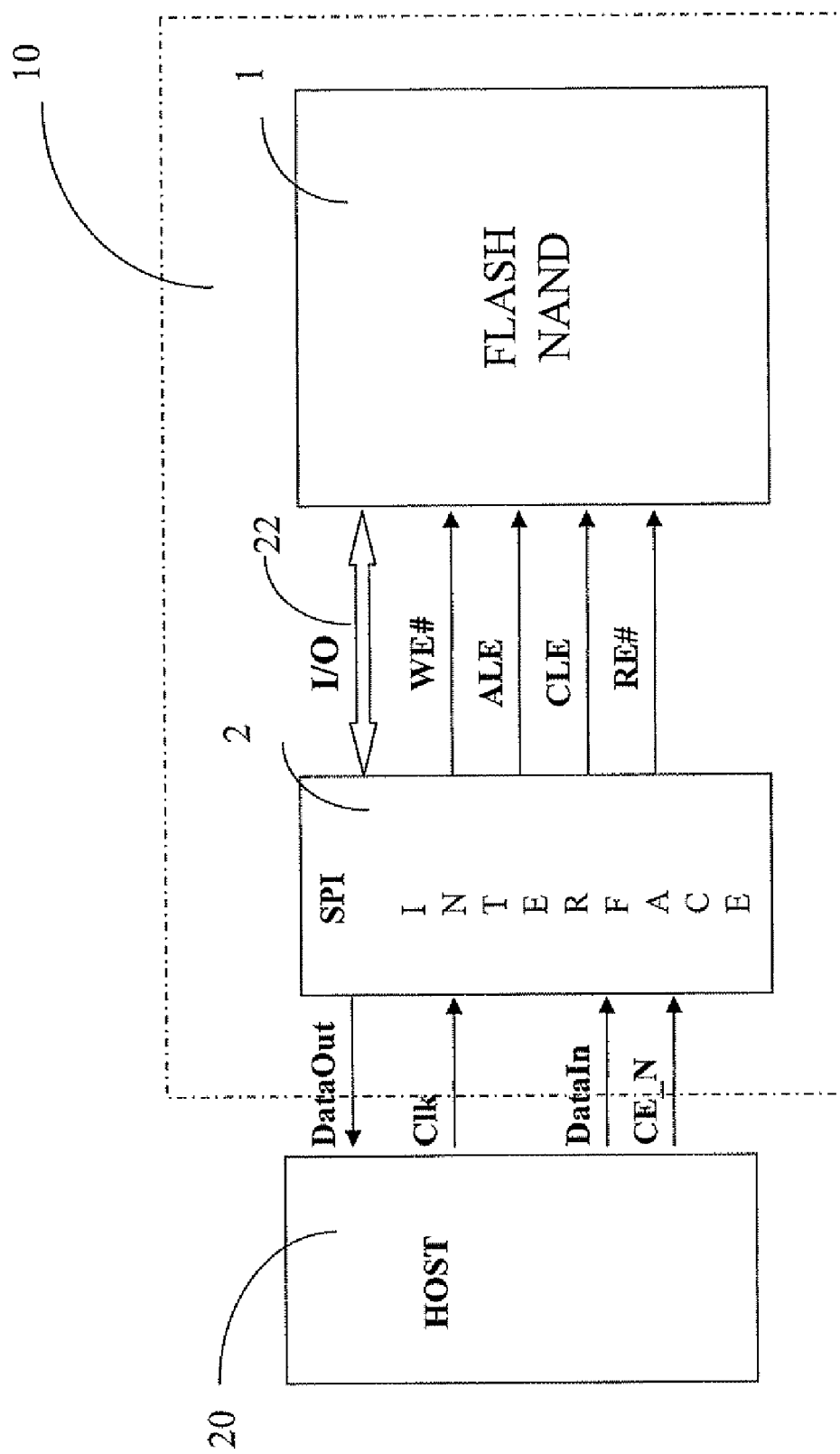
FIG. 1 schematically shows a memory architecture according to the present invention.

With reference to such figures, and in particular to FIG. 1, a memory architecture realized according to the present invention is illustrated and globally indicated with the reference number 10. In particular, the memory architecture 10 comprises a memory device 1 associated with an interface of the SPI type or SPI 2 in order to be connected to a host device 20. Advantageously, the memory device 1 is a Flash NAND memory.

In this way, the memory architecture 10 shows the following desired features: high density, fast erase and fast program. Moreover, as it will be clear from the following description, the SPI operations are based on a communication protocol which is completely independent from a Command Set of the memory device 1. In this way, if the memory device Command Set changes, the SPI 2 interface that connects the host device 20 remains the same.

The communication protocol supporting the SPI 2 is also completely independent from a size of the memory device 1, rendering the addressing of its memory location independent. In this way, if the memory device 1 is substituted, the SPI 2 interface connecting the host device 20 remains the same.

Finally, the use of the SPI 2 allows a minimum impact on the hardware complexity of the memory architecture 10 as a whole.

As already explained with respect to the prior art discussion, the SPI is based on the following four signals (and corresponding lines):

DataIn: a first data signal from the host device 20 to the memory device 1;

DataOut: a second data signal from the memory device 1 to the host device 20;

CLK: a clock signal from the host device 20 to the memory device 1; and

CE_N: a select signal from the host device 20 to the memory device 1.

It is important to note that there can be no more than one memory device 1 that is transmitting data during any particular transfer, which is not shown in the figure for sake of simplicity.

In particular, the clock signal CLK is a signal providing the timing of the SPI 2. Instructions, addresses, or data at a corresponding serial data input are latched on a rising edge of this clock signal CLK and data on a serial data output changes after a falling edge of this clock signal CLK.

Also, the second data signal DataOut (or Serial Data Output) is an output signal used to transfer data serially out of the memory device 1 to the host device 20 through the SPI 2. Data is shifted out on the falling edge of the clock signal CLK. Unless data are available, the serial data output is in a high impedance state.

In a similar manner, the first data signal DataIn (or Serial Data Input) is an input signal used to transfer data serially into the memory device 1 from the host device 20 through the SPI 2. The serial data input receives instructions, addresses and data to be programmed, the received values being latched on the rising edge of the clock signal CLK.

Finally, the select signal CE_N makes it possible to identify and address the memory device 1 in a hardware manner. In particular, when the select signal CE_N is high, the corresponding memory architecture 10 is deselected. The NAND memory device 1 is in the standby mode and the SPI 2 is disabled. When the select signal CE_N falls low, the corresponding memory architecture 10 is enabled, placing it in the active power mode.

After a power-up phase, a rising edge of the clock signal CLK, with the select signal CE_N being low, is required to start any SPI instruction from the SPI 2. During an SPI instruction, the line of the select signal CE_N should be kept low. If such a line is driven high, the current SPI instruction will be aborted and a new SPI instruction will start as soon as the select signal CE_N line is driven low and a rising edge of the clock signal CLK is given.

In other words, for every command, a memory device 1 is selected by asserting the select signal CE_N, which is normally active low. Advantageously, with the memory device 1 being in the NAND configuration, the assertion of the select signal CE_N indicates also the beginning of a new transaction by using the SPI 2 or SPI transaction.

The select signal CE_N should be continuously active for the duration of an SPI transaction (which comprises a command and a response). If the select signal CE_N is not active, the corresponding SPI transaction is aborted and the memory device 1 associated to the SPI 2 waits for a new transaction.

Also, the SPI 2 is connected to the memory device 1 by an Input/Output buffer I/O 22 and provides the memory device 1 with the following well known signals which flow in corresponding and equally labeled lines:

WE# is a Write Enable signal. The WE# line controls the data and command on the I/O lines during a write sequence. The I/O lines are latched on the rising edge of the WE# signal.

ALE is an address latch enable signal. The ALE line controls writing to the address register. When the ALE signal is high, the address is loaded on the rising edge of WE# signal. The ALE signal should remain high during an entire address sequence.

CLE is a command latch enable signal. The CLE line controls writing to the command register. When the CLE signal is high, the command is loaded on the rising edge of the WE# signal.

RE# is a read enable signal. The RE# line controls the data and status output on the I/O lines. The data output is triggered on the falling edge of the RE# signal.

Figure 2:
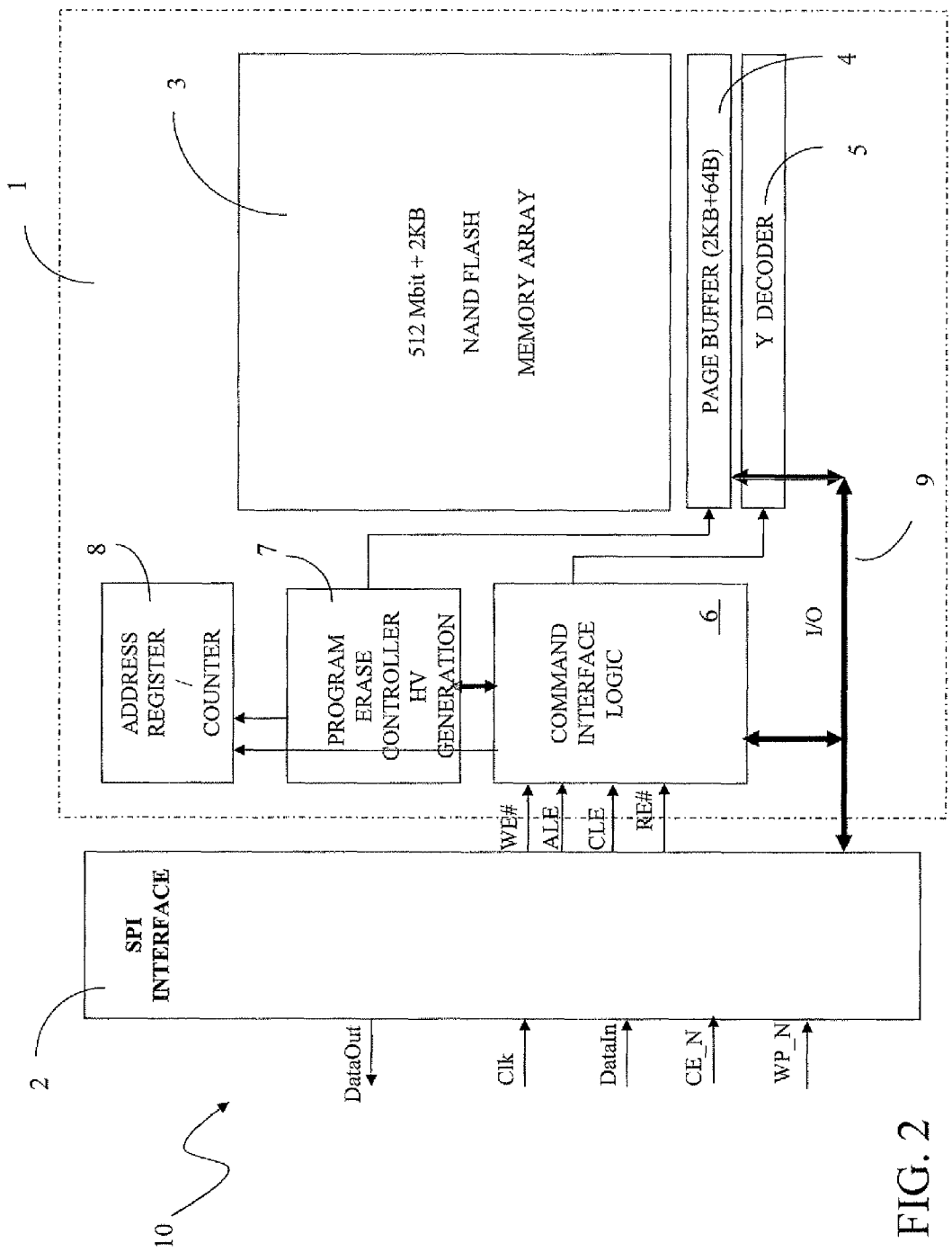
FIG. 2 shows in greater detail the memory architecture of FIG. 1.

In particular, as shown in FIG. 2, the memory device 1 comprises a NAND Flash memory matrix 3, associated to a page buffer 4 and to a decoder 5 in a known manner.

The memory device 1 also comprises a command interface logic 6 which is connected to the SPI 2 and receives the signals WE#, ALE, CLE, RE# and CONTROL/DATA there from. The SPI 2 also receives a signal WP_N which is Write Protect signal. The WP_N line provides protection when programming or erasing are performed on the memory device 1.

In particular, the WP_N signal puts the memory device 1 in a Hardware Protect mode. When the WP_N line is connected to a boosted supply line Vss, the memory device 1 becomes read-only by protecting them from write, program and erase operations. The WP_N line should be connected to the boosted supply line Vss during the Power-up phase to protect the memory device 1. When the WP_N line is connected to a power supply line Vcc, the memory device 1 follows a software protection (Write Enable/Write Disable command)

The memory device 1 also comprises a control and supply block 7 which is two-way connected to the command interface logic 6 and to a register and counter block 8, in which the command interface logic 6 is also directly connected.

In particular, the control and supply block 7 provides for controlling the program and erase operation as well as for generating required high voltage values. Also, the register and counter block 8 comprises at least an address register and a counter. Finally, the control and supply block 7 is connected to the page buffer 4 and the command interface logic 6 is connected to the decoder 5.

It should be emphasized that the memory architecture 10 has the common characteristic of an SPI architecture, i.e., it provides for a byte transfer. All data are multiples of bytes and, always, the byte is aligned to the CE_N signal edges.

For each standard NAND bus operation (Command Input, Address Input, Data Input, Data Output), there is an SPI instruction whose effect is the setting of the lines (WE, RE, ALE, CLE) and I/O Bus (1 Byte) required to operate with the standard NAND device, as shown in FIG. 3.

Advantageously, given in the correct order the SPI Instructions, a user of the memory architecture 10 can reproduce all of the Standard NAND operation set.

The SPI Instructions are also reported in the follow table, as well as the corresponding setting in a standard NAND interface, which the SPI interface reproduces internally the device.

TABLE I

| SPI Instruction | I/O Bus | WE_N | RE_N | ALE | CLE |
|---|---|---|---|---|---|
| Command Input | Command | 0 | 1 | 0 | 1 |
| Address Input | Address | 0 | 1 | 1 | 0 |
| Data Input | Data | 0 | 1 | 0 | 0 |
| Data Output | Data | 1 | 0 | 0 | 0 |
| Set MSB | — | — | — | — | — |
| Set LSB | — | — | — | — | — |
| Write Enable | — | — | — | — | — |
| Write Disable | — | — | — | — | — |

It should also be noted that few SPI Instructions do not have a correspondence with a standard NAND Interface: Write Disable and Write Enable used by SPI to handles the mechanism of Data Protection and SetMSB/SetLSB which set SPI configuration registers.

In fact, the mechanism of data protection with an SPI Interface is different from a Standard NAND Interface. For this reason the set of Standard NAND operations used for this is not available in the SPI Interface, but it is replaced by the Write Enable/Write Disable.

In particular, it is reminded that SetMSB Command sets the Most Significant Bit (MSB) first configuration active, and SetLSB Command sets the Less Significant Bit (LSB) first configuration active. By-default (Power-up) most significant bit first mode is selected.

The SPI 2 can be used in the following operating modes:

Shifting Data Mode. In this case, all instructions, addresses and data can be shifted in and out of the device, both in a most significant bit (MSB) first configuration and in a less significant bit (LSB) first configuration, according to an internal register which can be set by the user through two SPI commands.

Standby Mode. The only way to put an SPI Bus in standby mode is driving the CE_N line. The CE_N line puts the device in a Standby mode and resets the SPI interface. When the SPI bus is in a Stand-by mode and not transferring data, the clock signal CLK can remain both at 0 and 1.

Reset Mode. The resetting of the memory device 1 is obtained by issue a software reset command which resets the NAND memory matrix 3 followed by a CE_N signal pulse which resets the SPI 2.

Figure 4:
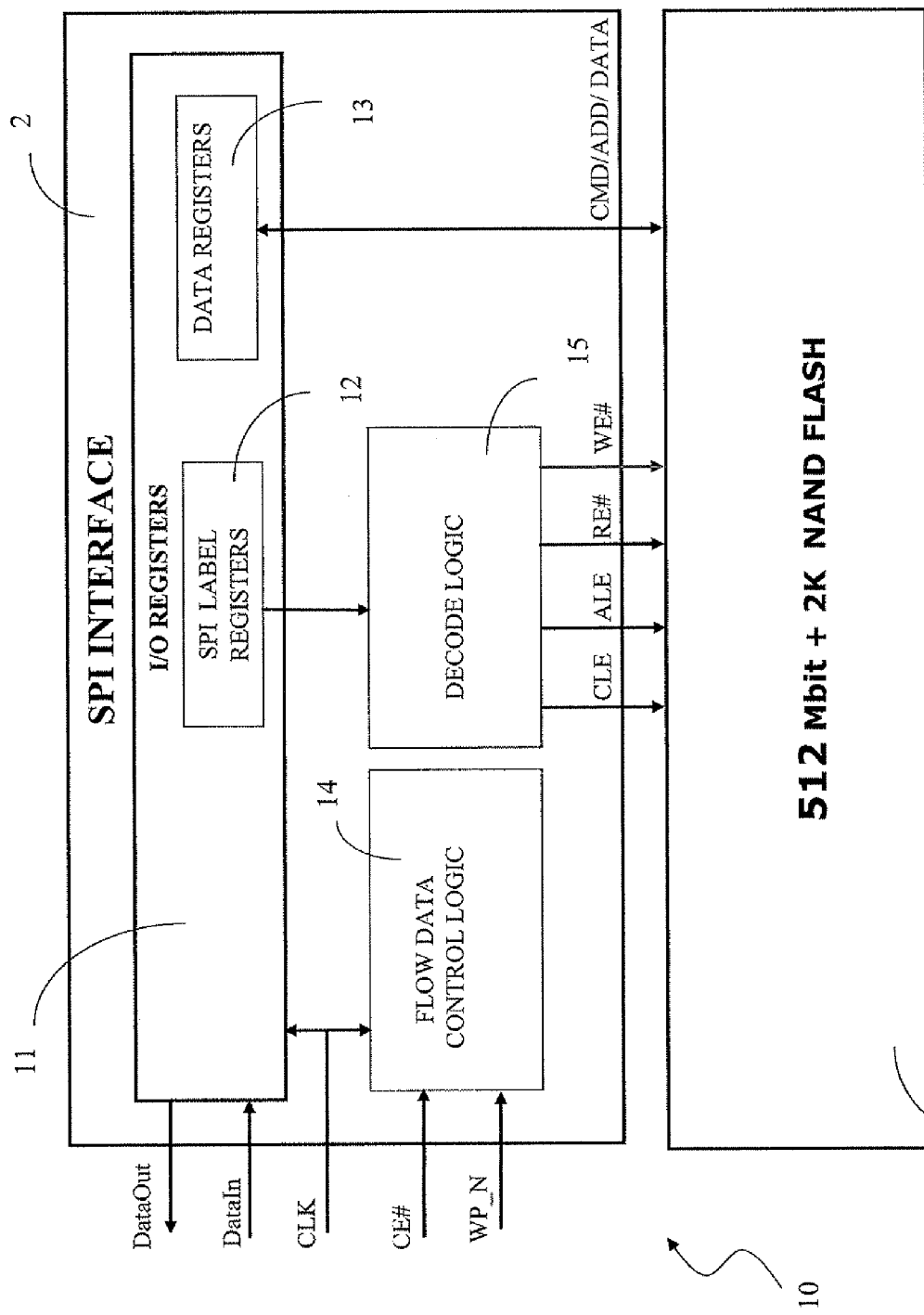
FIG. 4 shows in greater detail a portion of the memory architecture of FIG. 1.

The internal configuration of the SPI 2 according to the present invention is shown in FIG. 4. In particular, the SPI 2 comprises a I/O registers block 11 connected to the first data line DataIn and to the second data line DataOut, and in turn comprises SPI label registers 12 and data registers 13.

Also, the SPI 2 comprises a flow data control logic 14 connected to the select line CE_N and to the write protect line WP_N, as well as a decode logic 15, which is in turn connected to the SPI label registers 12 and provides the signals CLE, ALE, RE# and WE to the memory device 1.

The clock line CLK is connected both to the I/O registers block 11 and to the flow data control logic 14. Finally, the decode logic 15 is connected to a CMD/ADD/DATA bus.

It should be emphasized that, advantageously according to its internal configuration, the SPI 2 is independent from the Command Set and from the Address signal of the NAND Flash memory matrix 3. In this way, by also changing these Command Set and the Address signal of the memory matrix 3 of a memory architecture 10, the SPI 2 does not need to be changed accordingly.

This advantageous feature is obtained by using a decode logic 15 which is not connected to the data registers 13 and is thus not dependent on the data provided to the memory device 1. The decode logic 15 only sets in a correct manner the lines CLE, ALE, RE# and WE#, independently from the fact that a datum, a command or an address byte is provided to the memory device 1. The latter is completely handled by a user.

Also, advantageously according to the SPI 2, the lines CLE, ALE, RE# and WE# are set by using a dedicated SPI label registers 12, which is in turn directly handled by the user.

The invention also relates to a communication protocol for the SPI 2, also indicated as an SPI Protocol. The main features of the SPI protocol according to the invention are as follows: a communication starts when the select signal CE_N is driven Low; the communication is completely synchronous with the Clock signal CLK; and every SPI instruction sequence starts with one-byte instruction code.

According to the instruction this might be followed by NAND command bytes, by address bytes, and by data bytes. In case of data reading or status register reading, the shifted-in instruction sequence is followed by a data-out sequence.

In particular, all instructions, addresses and data can be shifted in and out of the memory device 1 by the SPI 2, both in a MSB first mode and in a LSB first mode, according to the I/O registers block 11 and the decode logic 15, which are be set by an SPI command.

By default (Power up) MSB first mode is selected. The communication starts on a first rising edge of the clock signal CLK after the select signal CE_N is driven Low. On the same rising edge, the first information bit is latched.

In particular, each communication provides for the shifting of a SPI packet providing one of the following information:
1. Memory Address
2. Memory Command
3. Memory Data Input
4. Memory Data Output
5. Status Register Output
6. Configuration Register Input Each SPI packet is in particular composed by a label byte, which identifies the type of information, a certain number of information bytes and a last byte which is always a null or do not care byte. After the do not care byte, a new SPI packet can be shifted in, or alternatively, driving the select signal CE_N high. The memory device 1 can be put in a standby mode.

If a select signal CE_N pulse happens during a SPI packet shifting the packet, it will not be handled correctly. It should be emphasized that the communication by the SPI packets insures execution of all the device operations foreseen by the Standard NAND command set.

The format of an SPI packet is listed in the following table:

TABLE II

| SPI Packet | Label Byte0 | Byte1 | Byte2 | Byte3 | Byte 2114 |
|---|---|---|---|---|---|
| Memory Command | 01h | Command | X | — | — |
| Memory Address | 02h | Address | X | — | — |
| Memory Data In | 04h | DataIn0 | DataIn1 | Data2 | X |
| Memory Data Out | 08h | X | DataOut0 | DataOut1 | DataOut2K |
| StatusReg Output | 10h | X | SR | — | — |
| Write Enable | 01h | 24h | X | — | — |
| Write Disable | 01h | 2Ah | X | — | — |
| SetMSB | 81h | 42h | X | — | — |
| SetLSB | 81h | 24h | X | — | — |

Wherein SPI packets labeled X correspond to a do not care byte.

Figure 5:
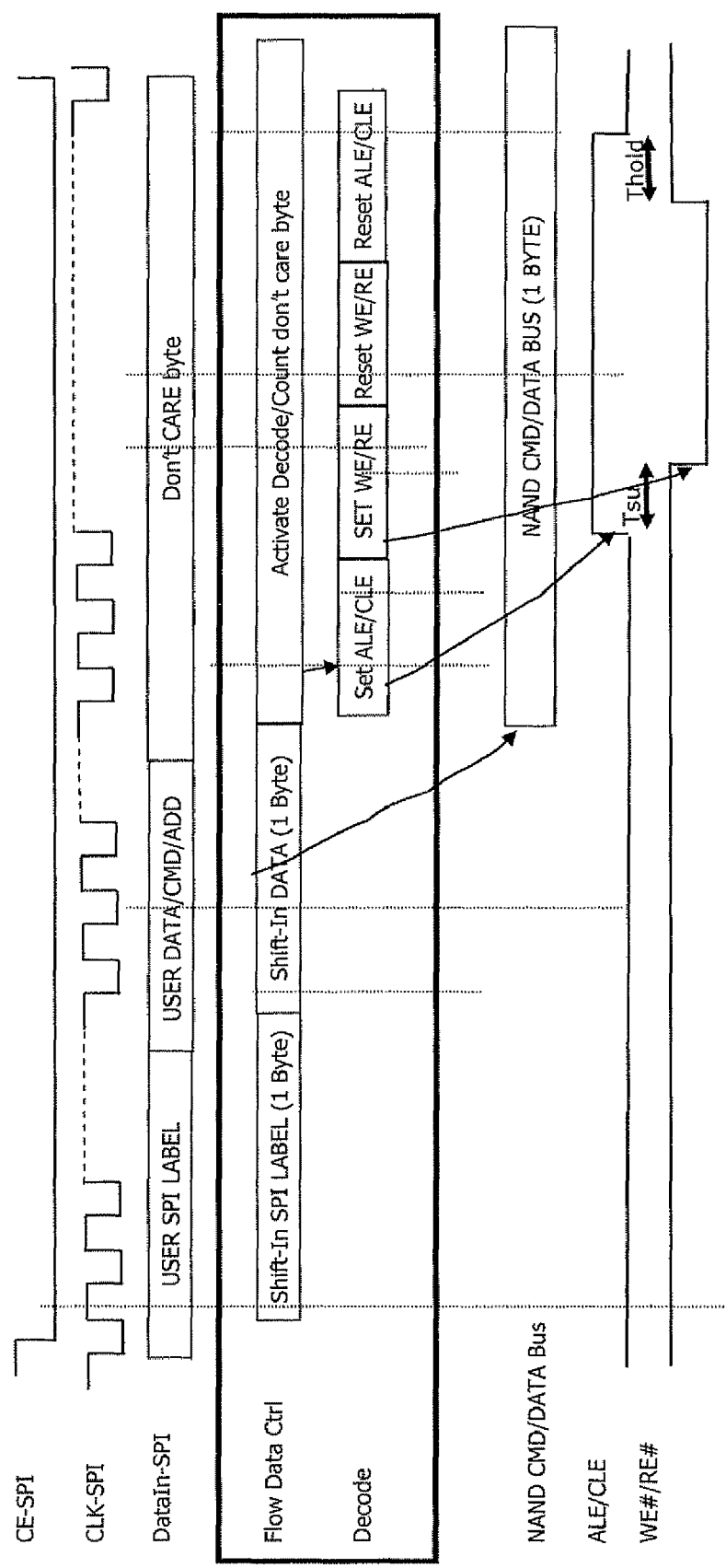
FIG. 5 schematically shows, using a common timing base, internal signals of the memory architecture of FIG. 1.

The signal timing of the above-described protocol is shown in FIG. 5. In conclusion, the memory architecture 10 comprises a memory device 1 provided with an SPI 2 has the following advantages: fast program and fast erase phases; high density memory value due to the use of the NAND Flash memory matrix 3; completely Command Set independence; very low area required; and no hardware modifications to commonly used NAND devices due to the use of the SPI 2.

Moreover, the SPI hardware block realizing the SPI 2 can be reused easily with any other NAND Flash memory matrix, i.e., an SPI 2 realized according to the invention can be used for a whole family of NAND Flash devices.

That which is claimed:

1. A memory architecture comprising:
    a NAND Flash memory; and
    a serial peripheral interface (SPI) to couple said memory to
        a host device, said SPI comprising
        a data in line to supply output data from the host device to inputs of said memory,
        a data out line to supply output data from said memory to an input of the host device,
        a clock line to be driven by the host device, and
        an enable line to allow said memory to be turned on and off by the host device, said serial peripheral interface to detect an edge transition of a clock signal on said clock line and an active signal on said enable line, and in response to said edge transition and said active signal, and only in response thereto, beginning a new command transaction.

2. A memory architecture according to claim 1 wherein said SPI comprises an I/O registers block comprises
    SPI label registers; and
    data registers for driving separately data, commands and addresses directed to said memory from corresponding SPI label registers.

3. A memory architecture according to claim 2 wherein said SPI comprises decode logic coupled to said SPI label registers for providing a write enable signal, an address latch enable signal, a command latch enable signal, and a read enable signal to said memory.

4. A memory architecture according to claim 3 wherein said decode logic sets the write enable signal, the address latch enable signal, the command latch enable signal, and the read enable signal independently from a type of data provided to said memory by said data registers.

5. A memory architecture according to claim 1, said memory including a Command Set and said Command Set and a size of said memory are independent from said SPI.

6. A memory architecture according to claim 1 further comprising an input/output buffer coupled between said SPI and said memory, said input/output buffer providing said memory with signals to drive reading and writing operations from and to said memory, the signals comprising a write enable signal, an address latch enable signal, a command latch enable signal, a read enable signal, and a command/address signal.

7. A memory architecture according to claim 6 wherein said memory comprises a command interface logic coupled to said SPI, said SPI receiving the signals associated with said input/output buffer, and receiving a write protection signal providing write protection when said memory is being programmed or erased.

8. A memory device comprising:
a memory; and
a serial peripheral interface (SPI) to couple said memory to a host device, said SPI comprising
a data in line to supply output data from the host device to inputs of said memory,
a data out line to supply output data from said memory to an input of the host device,
a clock line to be driven by the host device, and
an enable line to allow said memory to be turned on and off by the host device, said serial peripheral interface to detect an edge transition of a clock signal on said clock line and an active signal on said enable line, and in response to said edge transition and said active signal, and only in response thereto, beginning a new command transaction.

9. A memory device according to claim 8 wherein said memory comprises a NAND Flash memory.

10. A memory device according, to claim 9 wherein said SPI comprises decode logic coupled to said SPI label registers for providing a write enable signal, an address latch enable signal, a command latch enable signal, and a read enable signal to said memory.

11. A memory device according to claim 10 wherein said dedicated decode logic sets the write enable signal, the address latch enable signal, the command latch enable signal, and the read enable signal independently from a type of data provided to said memory by said data registers.

12. A memory device according to claim 8 wherein said SPI comprises an I/O registers block comprises
SPI label registers; and
data registers for driving separately data, commands and addresses directed to said memory from corresponding SPI label registers.

13. A memory device according to claim 8 including a Command Set, said Command Set and a size of said memory are independent from said SPI.

14. A memory device according to claim 8 further comprising an input/output buffer coupled between said SPI and said memory, said input/output buffer providing said memory with signals to drive reading and writing operations from and to said memory, the signals comprising a write enable signal, an address latch enable signal, a command latch enable signal, a read enable signal, and a command/address signal.

15. A memory device according to claim 14 wherein said memory comprises a command interface logic coupled to said SPI, said SPI receiving the signals associated with said input/output buffer, and receiving a write protection signal providing write protection when said memory is being programmed or erased.

* * * * *